United States Patent Office 2,957,789
Patented Oct. 25, 1960

2,957,789

SEMICONDUCTOR DEVICES AND METHODS OF PREPARING THE SAME

Erik M. Pell, Scotia, N.Y., assignor to General Electric Company, a corporation of New York No Drawing. Filed Mar. 13, 1959, Ser. No. 799,126

3 Claims. (Cl. 148—1.5)

The present invention relates to improved semi-conductor devices and to methods of preparing the same. More particularly, the present invention relates to germanium and silicon semi-conductor bodies having lithium as a donor impurity therein.

In my copending application Serial Number 735,411 filed May 15, 1958, entitled "Semiconductor Devices and Methods for Making the Same," and assigned to the assignee of the present invention, there are disclosed and claimed semiconductor methods and devices formed with a very wide intrinsic region therein by the diffusion of a highly mobile ion in semiconductor bodies under the influence of an electric field. One highly mobile ion utilized for the formation of such devices is lithium. It has been found that under certain circumstances, it is desirable that the mobility of lithium in germanium and silicon semiconductor bodies be retarded so that the devices formed thereby are more stable at high operating temperatures and may be formed with greater control.

Accordingly, it is an object of the present invention to form improved semiconductor bodies wherein lithium is an electrically significant activator impurity.

Another object of the present invention is to provide improved semiconductor bodies utilizing lithium as an activator impurity therein wherein the mobility and diffusion coefficient of the lithium is decreased.

Still another object of the present invention is to provide lithium impregnated semi-conductor bodies which are more stable at high operating temperatures.

Yet another object of the present invention is to provide methods for forming improved semiconductor bodies utilizing lithium as an activator impurity therein.

In accord with the present invention germanium and silicon semiconductor bodies having greater temperature stability and capable of being formed with greater control are formed by diffusing lithium into a body of a semiconductor which contains a high concentration of oxygen atoms. The lithium and oxygen form an associated donor complex which greatly enhances the temperature stability of the semi-conductor bodies and facilitates greater control in the formation thereof. In accord with separate aspects of the present invention, an entire body of semiconductor material may be transformed to N-conductivity type, or a P-N junction may be formed in a P-conductivity type wafer by the diffusion of lithium thereinto.

The novel features believed characteristic of the present invention are set forth in the appended claims. The invention itelf, however, together with further objects and advantages thereof may best be understood by reference to the following detailed description.

In the aforementioned copending application Serial Number 734,411, the disclosure of which is incorporated herewith by reference thereto, there is disclosed and claimed my discovery that certain highly mobile ions and atoms may be diffused under the influence of an electric field at P–N junction within semiconductor bodies to form broad intrinsic regions. When lithium is the mobile ion and silicon or germanium the semiconductor, I have discovered, in accord with the present invention, that the temperature stability and control obtained in the disclosed and claimed process may be greatly enhanced by reducing the diffusivity of lithium ions in silicon and germanium semiconductor bodies by associating the lithium ions with oxygen atoms to form what is believed to be a donor complex $LiO^+$. This donor complex has the same electrical effect upon the semiconductor body as does the unassociated lithium ion; however, the diffusion coefficient thereof is greatly reduced. Devices utilizing regions rendered N-conductivity type by incorporation of this donor complex therein exhibit much greater thermal stability than do the same devices which utilize the unassociated lithium ions.

The advantages gained by the present invention are believed due to the fact that the presence of the $LiO^+$ complex ion substantially lowers the diffusion coefficient of the lithium present. Thus, for example, at 25° C., lithium in the absence of oxygen has a diffusion coefficient of approximately $10^{-14}$ cm.$^2$/sec. in silicon, whereas at the same temperature lithium in the presence of oxygen has a diffusion coefficient of approximately $10^{-18}$ cm.$^2$/sec. At 50° C. lithium in the absence of oxygen has a diffusion coefficient of approximately $10^{-13}$ cm.$^2$/sec., whereas lithium in the presence of oxygen has a diffusion coefficient of approximately $10^{-16}$ cm.$^2$/sec. in silicon. At 100° C. lithium in the absence of oxygen has a diffusion coefficient of approximately $10^{-12}$ cm.$^2$/sec., whereas lithium in the presence of oxygen has a diffusion coefficient of approximately $10^{-14}$ cm.$^2$/sec. in silicon.

In accord with the present invention, I have found that the advantages thereof may be obtained by preparing a germanium or silicon single crystal with a very high concentration of oxygen therein. This concentration should be from approximately $1\times10^{18}$ to $2\times10^{18}$ atoms of oxygen per cubic centimeter of semiconductor material. This high concentration of oxygen in silicon may be obtained by deliberately introducing oxygen gas into the atmosphere within which a monocrystalline ingot thereof is being grown. While this may be accomplished by growing the silicon by seed crystal withdrawal from a quartz ($SiO_2$) crucible while the molten silicon within the crucible is agitated sufficiently to cause oxygen to be dissolved from the crucible by the molten silicon, preferably silicon having the desired concentration of oxygen is obtained by growing a monocrystalline ingot from a melt of high purity silicon in a helium or inert gas atmosphere containing a partial pressure of approximately 10 millimeters of oxygen. Likewise, high purity silicon is preferably obtained with the desired concentration of oxygen therein by growing a monocrystalline ingot thereof by the floating zone technique which is, for example, described in U.S. Patent Number 2,855,335 to Seiler, so that all other impurities are removed therefrom but performing the process in an atmosphere of helium containing a partial pressure of approximately 10 millimeters of oxygen. By this process, a concentration of from 1 to $2\times10^{18}$ atoms of oxygen per cubic centimeter of silicon may readily be obtained. This concentration of oxygen is extremely high, as compared with the concentration of oxygen which is usually present in monocrystalline silicon ingots, since oxygen is generally viewed as an undesirable impurity therein and great pains are usually expended as, for example, by using the floating zone technique of forming monocrystalline ingots of silicon, in order to preclude the presence of oxygen therein.

Once a semiconductor body containing from 1 to $2\times10^{18}$ atoms of oxygen per cubic centimeter thereof has been prepared, a concentration of lithium greater than approximately $10^{13}$ atoms per cubic centimeter thereof but no greater than $2\times10^{18}$ atoms per cubic centimeter thereof is diffused into the semiconductor body. If it is desired that the entire semiconductor body exhibit N-conductivity type characteristics, then the entire body is impregnated with lithium. If, on the other hand, it is desired that a P–N junction device be formed, a monocrystalline wafer of silicon containing, for example, approximately $10^{15}$ atoms per cubic centimeter thereof of a low-activation-energy acceptor impurity therefor such as, for example, boron, aluminum, gallium or indium and having a resistivity of approximately 10 ohm-centimeters is prepared. This body is then processed, as is described hereinbefore, to cause from 1 to $2\times10^{18}$ atoms of oxygen per cubic centimeter thereof to be present therein and lithium ions are diffused into one surface adjacent region thereof a short distance sufficient to cause the formation of surface-adjacent region of N-conductivity type which forms a P–N junction with the remaining P-type portion of the silicon wafer.

In further accord with the present invention, semiconductor devices having wide intrinsic regions such as those set forth in my aforementioned copending application Ser. No. 735,411 or in accord with either of my copending applications Ser. Nos. 735,402 and 735,406, the latter now abandoned, both filed May 15, 1958, the disclosures of which are incorporated by reference herewith, both of which are also assigned to the assignee of the present invention, may be formed. In accord with this feature of the present invention, after a P–N junction is formed, as is described hereinbefore, a bias potential of, for example, 10 to 100 volts is applied across the P–N junction and the lithium ions present therein are caused to diffuse at high temperature under the influence of an electric field to form at least one wide intrinsic conductivity-type semiconductor region.

Devices formed in accord with the present invention may be operated at higher temperatures than semiconductor devices utilizing lithium only as a donor activator therein, due to the fact that lithium has a lower diffusion coefficient in the presence of oxygen than in the absence of oxygen and the devices are therefore more temperature-stable and the characteristics thereof are less likely to change due to thermal diffusion during the operating life of the devices. The formation of devices in accord with the present invention may be subjected to greater controls, since a more precise control over the amount of diffusion which takes place may be had due to the slower rate at which the lithium diffuses in the presence of oxygen. These devices may include only one P–N junction and may be used for rectification of alternating currents. Alternatively they may include two or more P–N junctions and may function as transistors, analog transistors, spacistors and the like for the generation, amplification and translation of electric signals.

The following examples of the formation of N-type semiconductor bodies and semiconductor bodies containing P–N junctions in accord with the present invention are given for a further teaching to those skilled in the art as specific instances in which the invention may be practiced. These examples are used in an illustrative fashion only and are not to be construed in a limiting sense.

*Example 1*

A monocrystalline ingot of P-type "semiconductor grade" purity silicon having a resistivity of approximately 10 ohm-centimeters and containing approximately $10^{15}$ atoms of boron per cubic centimeter thereof is prepared by zone refining and floating zone techniques as is well known to the art. The last step of floating zone preparation is modified, in that oxygen, at a partial pressure of 10 millimeters of mercury, is present in the helium atmosphere within which the ingot is grown. After this ingot is grown, a monocrystalline wafer approximately 1 centimeter square and 2 millimeters thick is cut therefrom. The wafer is lapped, polished, and etched and a suspension of $10^{-6}$ grams of lithium in mineral oil is painted upon one major surface thereof. The wafer is heated in a helium atmosphere at 450° C. for 1½ minutes. After heating, the wafer is removed and the region of about $10^{-2}$ cm. adjacent the surface upon which the lithium-in-oil suspension is painted, is found to be N-conductivity type, while the remainder of the crystal is of P-conductivity type. This crystal possesses a P–N rectifying junction therein and readily passes current in the forward direction while passing current in the reverse direction with difficulty.

*Example 2*

A monocrystalline ingot of "semiconductor grade" purity silicon of the same size as is set forth hereinbefore is prepared without the boron additive but with the addition of oxygen thereto. The crystal is lapped, polished, and etched and $10^{-4}$ gram of lithium in a mineral oil suspension is painted on one major surface. The wafer is placed in a silicon carbide lined, molybdenum crucible having an internal volume of approximately 5 cubic centimeters. A loosely fitting crucible cover is used to cover the crucible. The crucible is placed in an oven which is flushed with helium and heated to a temperature of approximately 800° C. This temperature is maintained for 15 minutes after which the article is cooled, the wafer is removed therefrom, and upon test, is found to be of N-conductivity type having a resistivity of approximately $10^{-3}$ ohm-centimeters. After room temperature annealing for 24 hours to remove excess lithium by precipitation, the resistivity is about $10^{-2}$ ohm-centimeters.

While the invention has been set forth hereinbefore with respect to certain embodiments and specific examples thereof it is readily apparent that many modifications and changes will occur to those skilled in the art. Accordingly, I intend by the appended claims to cover all such modifications and changes as fall within the true spirit and scope of the invention.

What I claim as new and desire to secure by Letters Patent of the United States is:

1. The method of preparing a thermally stable body of semiconductor material selected from the group consisting of germanium and silicon and having an N-type region therein containing lithium as a donor which method comprises: preparing an ingot of the material of semiconductor purity; growing a crystalline ingot thereof containing a concentration of oxygen about $10^{18}$ atoms thereof per cubic centimeter; cutting a wafer therefrom; and diffusing a concentration of $10^{13}$ to $2\times10^{18}$ atoms per cubic centimeter thereof of lithium into at least a surface-adjacent region of said wafer.

2. The method of preparing a thermally stable body of semiconductor material selected from the group consisting of germanium and silicon and having an N-type region therein containing lithium as a donor which method comprises: preparing an ingot of the material of semiconductor purity; growing a crystalline ingot thereof containing 1 to $2\times10^{18}$ atoms per cubic centimeter thereof of oxygen; cutting a wafer therefrom; and diffusing a concentration of $10^{13}$ to $2\times10^{18}$ atoms per cubic centimeter thereof of lithium into at least a surface surface-adjacent region of said wafer, said oxygen content being at least equal to said lithium content.

3. The method of preparing a thermally stable body of semiconductor material selected from the group consisting of germanium and silicon and having an N-type region therein containing lithium as a donor which method comprises: preparing an ingot of the material of semiconductor purity; growing a crystalline ingot thereof in an inert atmosphere containing a partial pressure of oxygen of approximately 10 to 1000 millimeters of mercury; cutting a wafer therefrom; and diffusing a concentration of $10^{13}$ to $2\times10^{18}$ atoms per cubic centimeter thereof of lithium into at least a surface-adjacent region of said wafer.

References Cited in the file of this patent

UNITED STATES PATENTS

| | | |
|---|---|---|
| 2,725,315 | Fuller | Nov. 29, 1955 |
| 2,770,761 | Pfann | Nov. 13, 1956 |
| 2,792,317 | Davis | May 14, 1957 |
| 2,794,846 | Fuller | June 4, 1957 |
| 2,879,190 | Logan | Mar. 24, 1959 |